(12) United States Patent
Chang et al.

(10) Patent No.: US 8,377,766 B2
(45) Date of Patent: Feb. 19, 2013

(54) METHOD OF MAKING THIN FILM TRANSISTOR

(75) Inventors: Chia-Ming Chang, Hsin-Chu (TW);
Hsiang-Chih Hsiao, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 275 days.

(21) Appl. No.: 12/716,279

(22) Filed: Mar. 3, 2010

(65) Prior Publication Data

US 2010/0320464 A1 Dec. 23, 2010

(30) Foreign Application Priority Data

Jun. 19, 2009 (TW) .............................. 98120617 A

(51) Int. Cl.
*H01L 21/00* (2006.01)
(52) U.S. Cl. ........ 438/159; 438/151; 438/669; 438/942; 257/E21.411; 257/E21.414

(58) Field of Classification Search .................... 257/57, 257/E21.411, E21.414; 438/151, 159, 669, 438/942
See application file for complete search history.

(56) References Cited

U.S. PATENT DOCUMENTS

| 6,255,130 B1 | 7/2001 | Kim |
| 6,876,428 B2 | 4/2005 | Kwak |
| 2005/0142681 A1* | 6/2005 | Soh ................................. 438/30 |
| 2008/0003526 A1* | 1/2008 | Kim et al. ..................... 430/313 |
| 2008/0073718 A1* | 3/2008 | Lee et al. ...................... 257/347 |

* cited by examiner

*Primary Examiner* — Robert Huber
(74) *Attorney, Agent, or Firm* — Winston Hsu; Scott Margo

(57) ABSTRACT

A photo-mask includes a first opaque pattern, a second opaque pattern, a transparent single slit, and a translucent pattern. The transparent single slit is disposed between the first opaque pattern and the second opaque pattern, and the width of the transparent single slit is substantially between 1.5 micrometers and 2.5 micrometers. The translucent pattern is connected to the first opaque pattern and the second opaque pattern.

16 Claims, 7 Drawing Sheets

| The length of the extension portion | Turn-on current (Ion)(A) (When V$_{GS}$=20V, V$_{DS}$=5V, and without the light exposure) | Ion % |
|---|---|---|
| 2 micrometers | 2.39E-06 | 100.0 % |
| 4 micrometers | 3.01E-06 | 126.0 % |
| 6 micrometers | 3.36E-06 | 140.4 % |

FIG. 7

METHOD OF MAKING THIN FILM TRANSISTOR

BACKGROUND OF THE INVENTION

1. Field of the Invention

The present invention relates to a thin film transistor, a photo-mask for defining a thin film transistor, and a method of making a thin film transistor, and more particularly, to a photo-mask for improving a channel length limitation of a thin film transistor, a thin film transistor with a short channel length, and a method of making the same.

2. Description of the Prior Art

In the thin film transistor liquid crystal display panel (TFT-LCD panel), a thin film transistor serves as a switch component controlling each pixel electrode. When the size and the resolution of the LCD panel improve, the size of the pixel electrode accordingly increases. Therefore, the thin film transistor has to provide a larger turn-on current (Ion) to enhance the charging ability. As known by the person skilled in the art, the quantity of the turn-on current is proportional to the channel width/length (W/L) ratio of the thin film transistor. The conventional method for enlarging the turn-on current is to increase the channel width of the thin film transistor. However, increasing the channel width of the thin film transistor may lead to some disadvantage, such as a lower aperture and an increasing load of resistances and capacitors. On the other hand, decreasing the channel length of the thin film transistor may also enlarge the turn-on current. But this method is difficult due to the limitation of the conventional photo-mask and the photolithographic process.

SUMMARY OF THE INVENTION

It is therefore one objective of the present invention to provide a thin film transistor, a photo-mask for defining a thin film transistor, and a method of making a thin film transistor to solve the aforementioned problem.

According to the present invention, a photo-mask is provided to define the pattern of the source/drain electrode and the channel of the thin film transistor. The aforementioned photo-mask includes a first opaque pattern, a second opaque pattern, a transparent single slit, and a translucent pattern. The first opaque pattern includes a first side edge and a second side edge, the second opaque pattern includes a third side edge and a fourth side edge, and the first side edge of the first opaque pattern is disposed in opposition to the third side edge of the second opaque pattern. The transparent single slit is disposed between the first side edge of the first opaque pattern and the third side edge of the second opaque pattern, wherein a minimum distance between the first side edge of the first opaque pattern and the third side edge of the second opaque pattern is substantially between 1.5 micrometers and 2.5 micrometers. The translucent pattern is connected to the second side edge of the first opaque pattern and the fourth side edge of the second opaque pattern.

According to the present invention, a thin film transistor is provided. The thin film transistor includes a substrate, a gate electrode, a gate insulating layer, a semiconductor layer, a source/drain electrode. The gate electrode is disposed on the substrate, and the gate insulating layer is disposed on the substrate and covers the gate electrode. The semiconductor layer is disposed on the gate insulating layer and the semiconductor layer includes a channel and an extension portion. The source/drain electrode is disposed on the semiconductor layer, wherein the drain electrode includes a first side edge and a second side edge, the source electrode includes a third side edge, and the first side edge of the drain electrode is disposed in opposition to the third side edge of the source electrode. Besides, a minimum distance between the first side edge of the drain electrode and the third side edge of the source electrode is substantially between 1.5 micrometers and 3.5 micrometers, and the extension portion extends to the outside of an imaginary extension line of the second side edge of the drain electrode.

According to the present invention, a method of making a source/drain electrode and a channel of a thin film transistor is provided. First, a substrate is provided. Then, a semiconductor layer and a metal layer are sequentially formed on the substrate. A photo-mask is provided, and the photo-mask includes a first opaque pattern, a second opaque pattern, a transparent single slit, and a translucent pattern. The first opaque pattern includes a first side edge and a second side edge, the second opaque pattern includes a third side edge and a fourth side edge, and the first side edge of the first opaque pattern is disposed in opposition to the third side edge of the second opaque pattern. The transparent single slit is disposed between the first side edge of the first opaque pattern and the third side edge of the second opaque pattern, wherein a minimum distance between the first side edge of the first opaque pattern and the third side edge of the second opaque pattern is substantially between 1.5 micrometers and 2.5 micrometers. Then, a photoresist layer is formed on the metal layer and an exposure process using the photo-mask is performed on the photoresist layer. The first opaque pattern and the second opaque pattern of the photo-mask correspond to a first region of the photoresist layer, the transparent single slit of the photo-mask corresponds to a second region of the photoresist layer, and the translucent pattern of the photo-mask corresponds to a third region of the photoresist layer. Following that, a development process is performed on the photoresist layer to remove a portion of the photoresist layer to uncover the metal layer. A thickness of the photoresist layer of the first region is thicker than a thickness of the photoresist layer of the second region and a thickness of the photoresist layer of the third region. Subsequently, the metal layer and the semiconductor layer uncovered by the photoresist layer are removed. An ashing process is performed on the photoresist layer to reduce the thickness of the photoresist layer of the first region, and the photoresist layers of the second region and the third region are removed to uncover the metal layer. The metal layer and a portion of the semiconductor layer uncovered by the photoresist layer are removed to define a source electrode, a drain electrode, a channel and an extension portion. Finally, the photoresist layer is removed.

The photo-mask of the invention has the design of the transparent single slit and the translucent pattern. Therefore, the channel length of the thin film transistor can be reduced by the transparent single slit, and the extension portion of the semiconductor layer can be defined by the translucent pattern. As a result, the thin film transistor has a larger turn-on current.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 7 shows a relation between the extension portion and the turn-on current.

DETAILED DESCRIPTION

Figure 1:
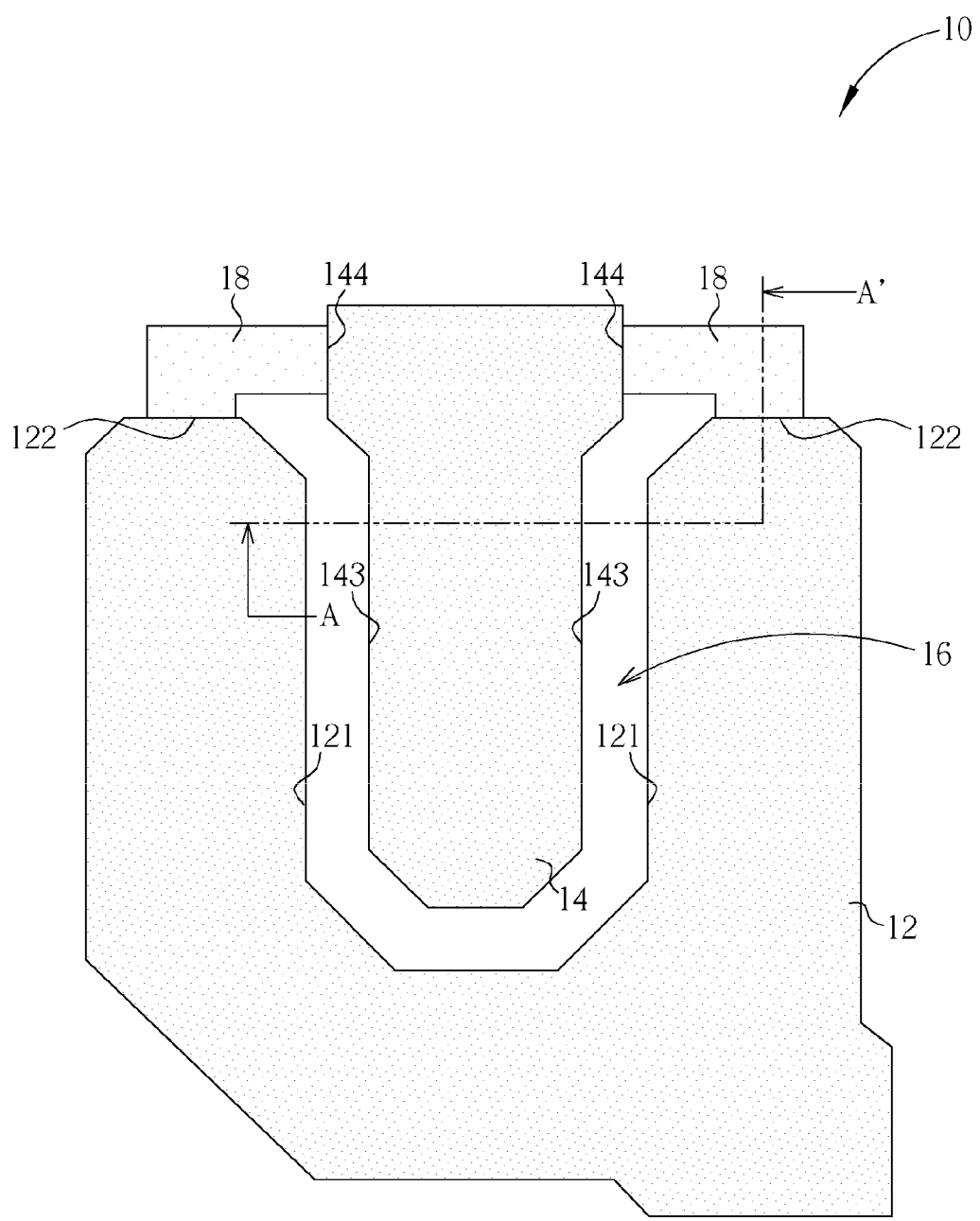
FIG. 1 schematically illustrates a photo-mask according to a preferred embodiment of the present invention.

Please refer to FIG. 1. FIG. 1 schematically illustrates a photo-mask according to a preferred embodiment of the present invention. In this embodiment, the photo-mask 10 may be a graytone mask (GTM), a halftone mask (HTM), or other mask having different transmittance at different regions. The photo-mask 10 includes a first opaque pattern 12, a second opaque pattern 14, a transparent single slit 16, and a translucent pattern 18. The first opaque pattern 12 includes a first side edge 121 and a second side edge 122, the second opaque pattern 14 includes a third side edge 143 and a fourth side edge 144, and the first side edge 121 of the first opaque pattern 12 is disposed in opposition to the third side edge 143 of the second opaque pattern 14. The transparent single slit 16 is disposed between the first side edge 121 of the first opaque pattern 12 and the third side edge 143 of the second opaque pattern 14, and a minimum distance between the first side edge 121 of the first opaque pattern 12 and the third side edge 143 of the second opaque pattern 14, i.e. the width of the transparent single slit 16, is substantially between 1.5 micrometers and 2.5 micrometers. In addition, the translucent pattern 18 is connected to both of the second side edge 122 of the first opaque pattern 12 and the fourth side edge 144 of the second opaque pattern 14. Therefore, the transparent single slit 16 is surrounded by the first opaque pattern 12, the second opaque pattern 14, and the translucent pattern 18 to form a closed single slit. Besides, the region beside the outside edges of the first opaque pattern 12, the second opaque pattern 14, and the translucent pattern 18 is a transparent region (not shown in the figure) to define the required pattern. More specifically, the outside edge of the first opaque pattern 12 is an unnamed side edge, i.e. the side edge far away from the first side edge 121 of the first opaque pattern 12, the outside edge of the second opaque pattern 14 is an edge (not shown in the figure) near the fourth side edge 144 but far away from the translucent pattern 18, and the outside edge of the translucent pattern 18 is an edge (not shown in the figure) far away from the translucent pattern 18. The first opaque pattern 12 and the second opaque pattern 14 consist of low transmittance materials or opaque materials, and the transmittance may be lower to 0%, i.e. completely opaque. Compared to the first opaque pattern 12 and the second opaque pattern 14, the translucent pattern 18 has higher transmittance. For example, in this embodiment, the transmittance of the translucent pattern 18 is between 25% and 40% and preferably between 30% and 35%, but it is not limited herein. Besides, the length of the translucent pattern 18, i.e. the length of the translucent pattern 18 which is vertical to the second side edge 122 of the first opaque pattern 12, is substantially between 2 micrometers and 7 micrometers and preferably between 5.5 micrometers and 6.5 micrometers, but it is not limited herein.

The photo-mask 10 of this embodiment is to define the pattern of the source/drain electrode and the semiconductor layer of the thin film transistor, wherein the first opaque pattern 12 and the second opaque pattern 14 are mainly used to define the pattern of the source/drain electrode, and the transparent single slit 16 is mainly used to define the length of the channel. In this embodiment, the width of transparent single slit 16 reduces to a value between 1.5 micrometers and 2.5 micrometers. Therefore, in the photolithography process, the diffraction occurs when light passes through the transparent single slit 16, so that the exposure dose and range of the photoresist layer corresponding to the transparent single slit 16 reduce to decrease the channel of the thin film transistor device. The translucent pattern 18 is used to define the extension portion of the semiconductor channel. For the thin film transistor device, the extension design of the semiconductor channel may increase the turn-on current.

Figure 2:
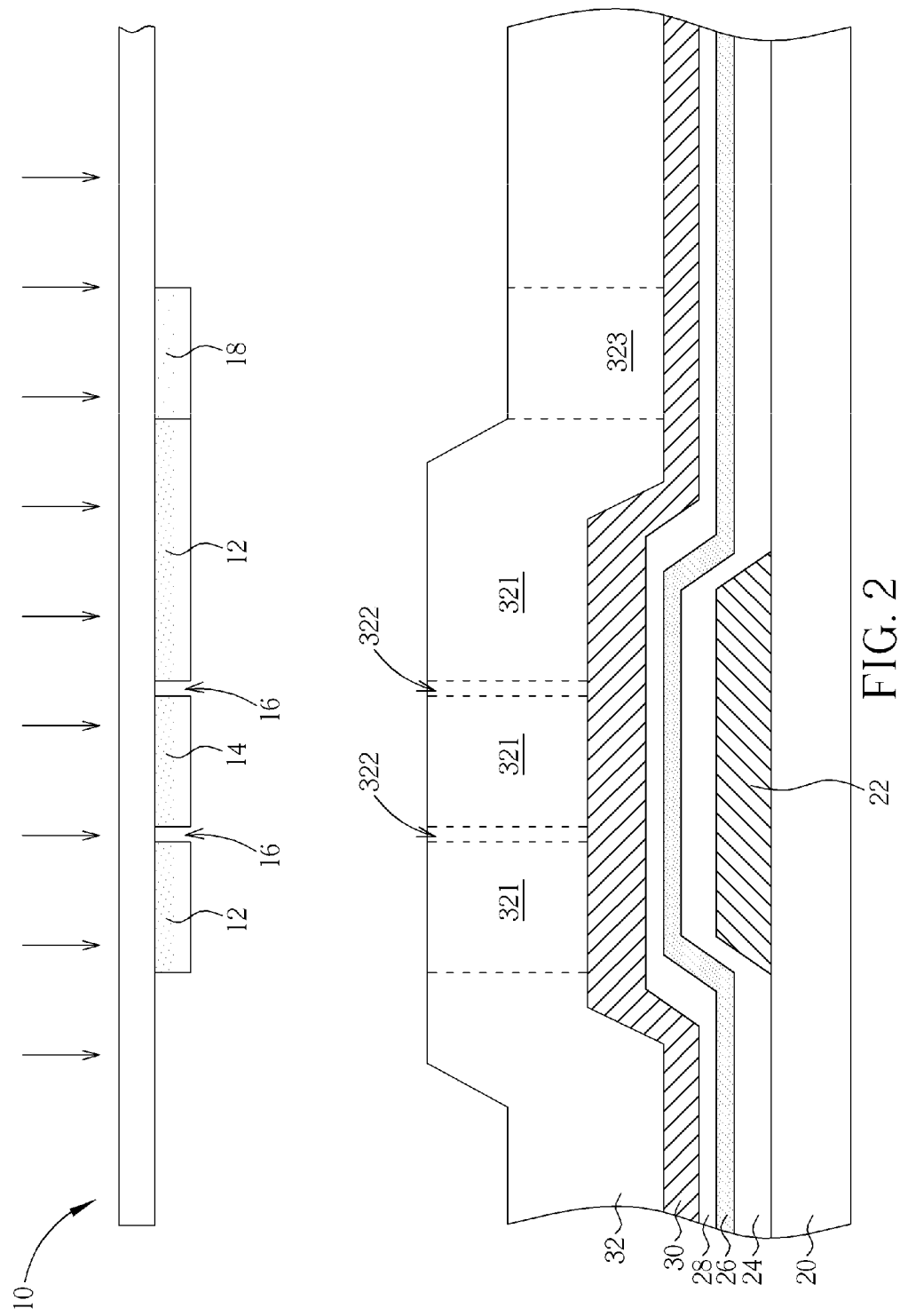
FIGS. 2-5 are schematic diagrams illustrating a method of using the photo-mask of FIG. 1 to form a source/drain electrode and a channel of a thin film transistor sensor according to a preferred embodiment of the present invention.

Please refer to FIGS. 2-5 and FIG. 1. FIGS. 2-5 are schematic diagrams illustrating a method of using the photo-mask of FIG. 1 to form a source/drain electrode and a channel of a thin film transistor sensor according to a preferred embodiment of the present invention, wherein FIGS. 2-5 are cross-section diagrams, and the cross-section profile of the photo-mask in FIG. 2 corresponds to the profile A-A' in FIG. 1. As shown in FIG. 2, the substrate 20 is provided. Then, the gate electrode 22, the gate insulating layer 24, the semiconductor layer 26, the heavily doped semiconductor layer (or ohmic contact layer) 28, and the metal layer 30 are sequentially formed on the substrate 20, wherein the heavily doped semiconductor layer 28 can be selectively formed on the substrate 20 by different design, and the semiconductor layer 26 may be an amorphous silicon semiconductor layer, but it is not limited herein. In other embodiments, the semiconductor layer 26 may be a single crystalline silicon semiconductor layer, a polycrystalline silicon semiconductor layer, a microcrystalline silicon semiconductor layer, a silicon germanium semiconductor layer containing the aforementioned crystal lattice, a silicon gallium semiconductor layer containing the aforementioned crystal lattice, InGaZnO4, other suitable materials, or a combination of the aforementioned materials. Besides, the photo-mask 10 is provided, wherein the feature of the photo-mask 10 is described previously and illustrated in FIG. 1. Subsequently, the photoresist layer 32 is formed on the metal layer 30. Then, an exposure process with photo-mask 10 is performed on the photoresist layer 32. In the exposure process, the first opaque pattern 12 and the second opaque pattern 14 of the photo-mask 10 correspond to the first region 321 of the photoresist layer 32, the transparent single slit 16 of the photo-mask 10 corresponds to the second region 322 of the photoresist layer 32, and the translucent pattern 18 of the photo-mask 10 corresponds to the third region 323 of the photoresist layer 32. By the design of the photo-mask 10, the photoresist layer 32 of the first region 321 may be covered by the first opaque pattern 12 and the second opaque pattern 14 and not exposed to light, and the photoresist layer 32 of the second region 322 may be exposed to light through the transparent single slit 16. However, the exposure dose of the second region 322 is not sufficient because of the effect of the single slit diffraction. The photoresist layer 32 of the third region 323 may be exposed to light through the translucent pattern 18, but the transmittance of the translucent pattern 18 is between 25% and 40% and therefore the exposure dose of the third region 323 is not sufficient. The photoresist layer 32 of this embodiment is a positive photoresist, but it is not limited herein. In other embodiments, when the photoresist layer 32 is a negative photoresist, the position of the first opaque pattern 12, the second opaque pattern 14, and the transparent single slit 16 of the photo-mask 10 is changed, i.e. the first opaque pattern 12 and the second opaque pattern 14 are the first/second transparent regions and the transparent single slit 16 is the opaque single slit. In this situation, the region beside the outside edges of the first opaque pattern 12, the second opaque pattern 14, and the translucent pattern 18 is an opaque region (not shown in the figure). Therefore, in the exposure process, the photoresist layer 32 with light exposure remains, but the photoresist layer 32 without light exposure is removed by the following development process.

Figure 3:
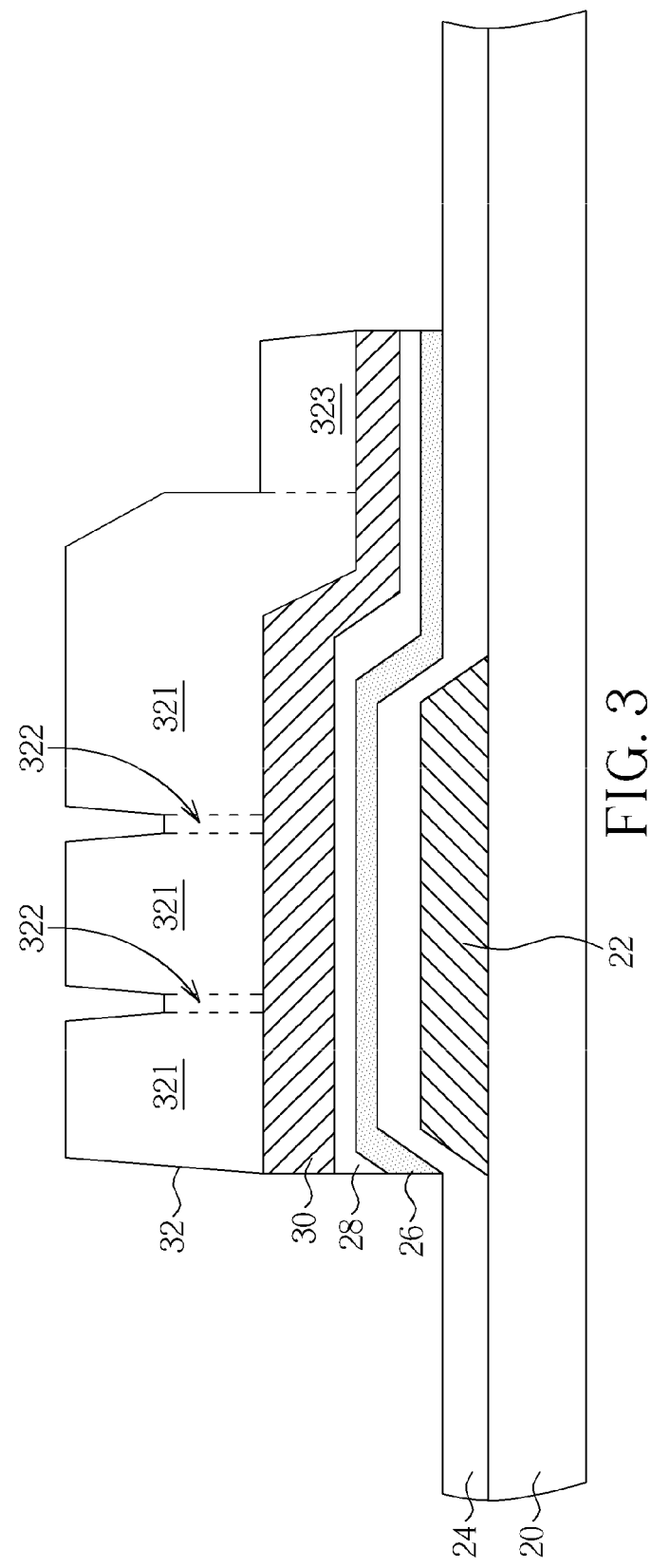

As shown in FIG. 3, subsequently, the development process is performed on the photoresist layer 32 to remove the photoresist layer 32 with light exposure to uncover the portion of the metal layer 30. Because of the different exposure doses, the thickness of the photoresist layer 32 of the first region 321 is thicker than the thickness of the photoresist layer 32 of the second region 322 and the thickness of the photoresist layer of the third region 323, and the thickness of the photoresist layer 32 of the second region 322 and the thickness of the photoresist layer of the third region 323 depend on the size of the transparent single slit 16 and the transmittance of the translucent pattern 18. Then, the process, such as an etching process, is performed to remove the metal layer 30, the heavily doped semiconductor layer 28, and the semiconductor layer 26 without the protection of the photoresist layer 32. It should be noted that the aforementioned photoresist layer 32 is a positive photoresist. However, in other embodiments, when the photoresist layer 32 as shown in FIG. 2 is a negative photoresist, the cross-section diagram as shown in FIG. 3 is also generated.

Figure 4:
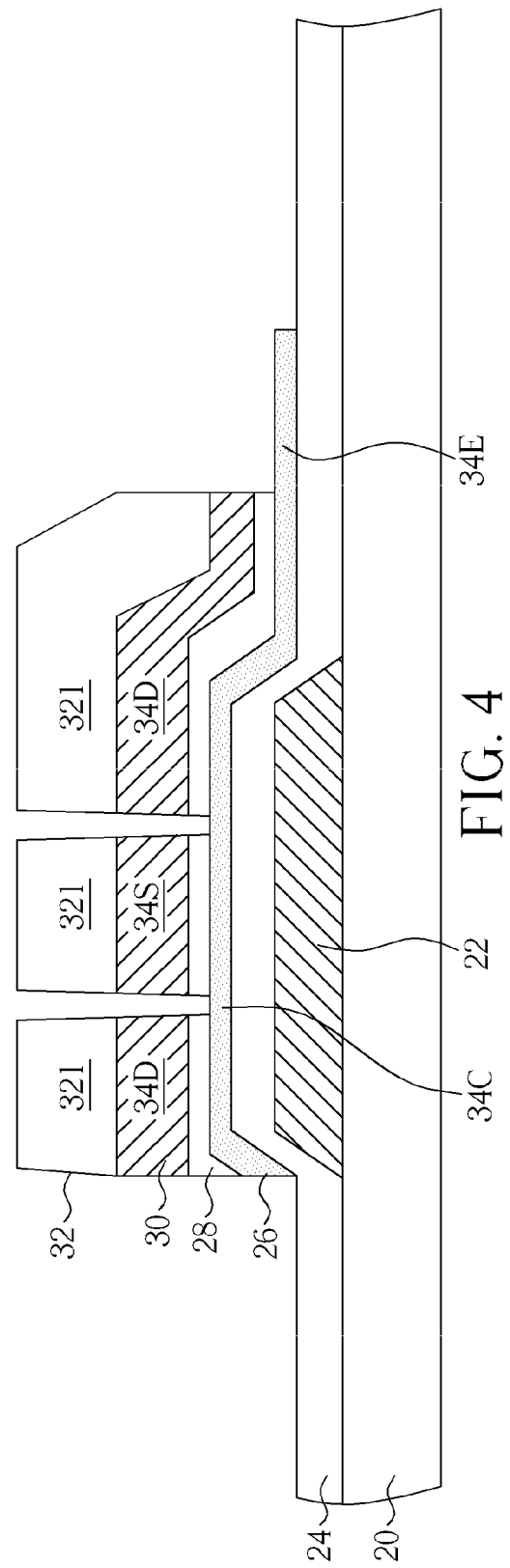

As shown in FIG. 4, the ashing process is performed on the photoresist layer 32 to reduce the thickness of the photoresist layer 32, so that the thickness of the photoresist layer 32 of the first region 321 decreases and the photoresist layer 32 of the second region 322 and the photoresist layer 32 of the third region 323 are removed to uncovered the metal layer 30 corresponding to the second region 322 and the third region 323. Subsequently, the process, such as an etching process, is performed to remove the metal layer 30 and the heavily doped semiconductor layer 28 without the protection of the first region 321 of the photoresist layer 32 to define the source electrode 34S, the drain electrode 34D, the channel 34C, and the extension portion 34E of the thin film transistor device. Following that, the photoresist layer 32 is removed to form the source electrode 34S, the drain electrode 34D, the channel 34C, and the extension portion 34E of the thin film transistor of this embodiment.

Figure 5:
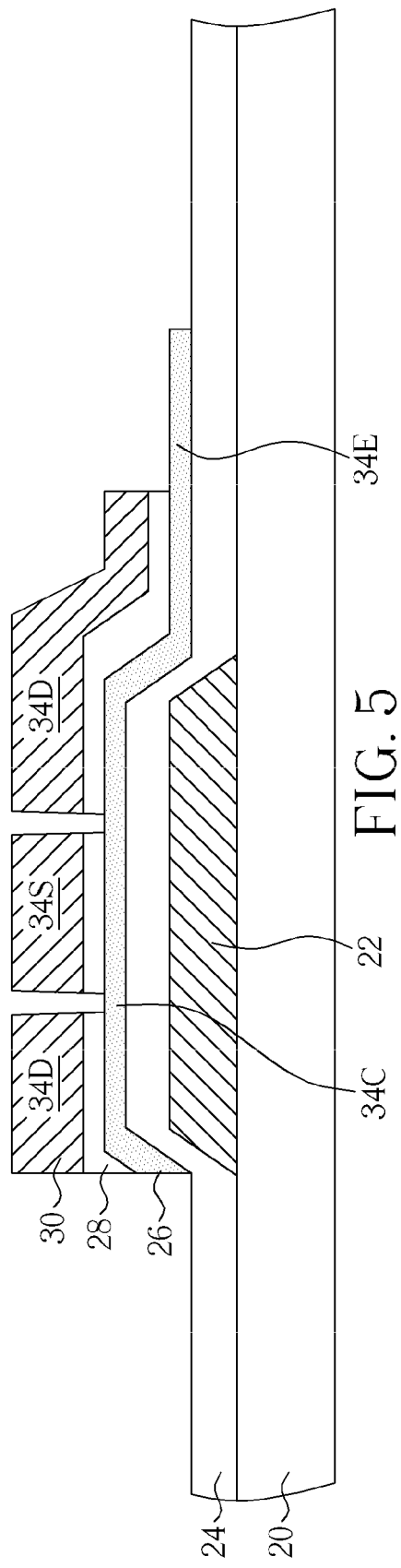
Figure 6:
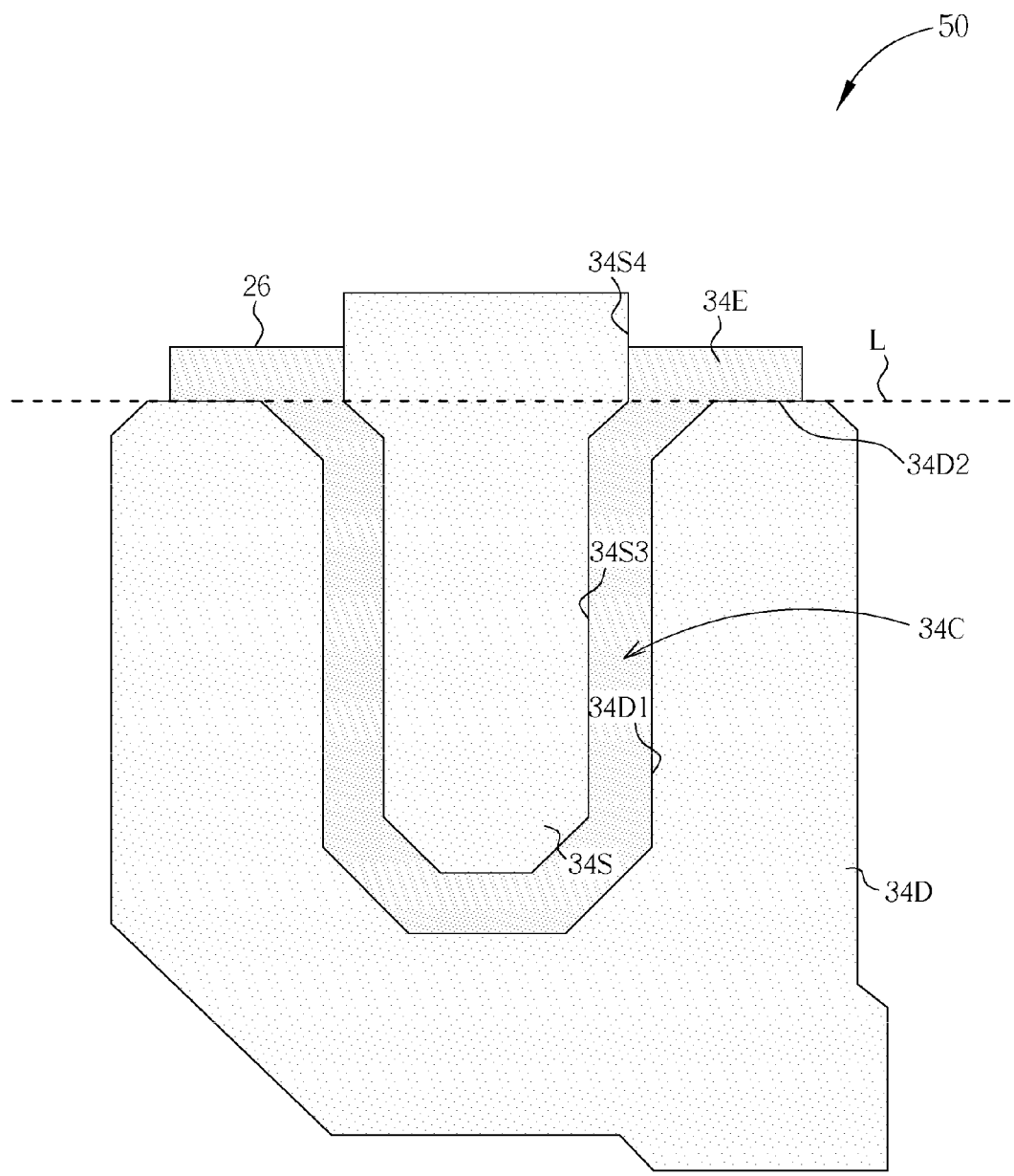
FIG. 6 is a top view of the thin film transistor of FIG. 5.

Please refer to FIG. 6 and FIG. 5. FIG. 6 is a top view of the thin film transistor of FIG. 5, wherein the thin film transistor of this embodiment is an asymmetrical thin film transistor device, but it is not limited herein. For example, the thin film transistor may be a symmetrical thin film transistor or another type of the thin film transistor. As shown in FIG. 5 and FIG. 6, the thin film transistor 50 of the embodiment includes the substrate 20, the gate electrode 22, the gate insulating layer 24, the semiconductor layer 26, the heavily doped semiconductor layer 28, the source electrode 34S, and the drain electrode 34D. The gate electrode 22 is disposed on the substrate 20, and the gate insulating layer 24 is disposed on the substrate 22 to cover the gate electrode 22. The semiconductor layer 26, such as an amorphous silicon semiconductor layer, is disposed on the gate insulating layer 24, and the semiconductor layer 26 includes the channel 34C and the extension portion 34E. The drain electrode 34D and the source electrode 34S are disposed on the semiconductor layer 26, wherein the drain electrode 34D includes the first side edge 34D1 and the second side edge 34D2, the source electrode 34S includes the third side edge 34S3 and the fourth side edge 34S4, and the first side edge 34D1 of the drain electrode 34D is disposed in opposition to the third side edge 34S3 of the source electrode 34S. The distance between the first side edge 34D1 of the drain electrode 34D and the third side edge 34S3 of the source electrode 34S is related to the width of the transparent single slit 16 of the photo-mask 10. In this embodiment, because the width of the transparent single slit 16 of the photo-mask 10 is substantially between 1.5 micrometers and 2.5 micrometers, the minimum distance between the first side edge 34D1 of the drain electrode 34D and the third side edge 34S3 of the source electrode 34S in the thin film transistor 50 is substantially between 1.5 micrometers and 3.5 micrometers, but it is not limited herein. Besides, the extension portion 34E of the semiconductor layer 26 extends to the outside of an imaginary extension line L of the second side edge 34D2 of the drain electrode 34D. The extension portion 34E is defined by the translucent pattern 18 of the photo-mask 10, and therefore the length of the extension portion 34E and the length of the translucent pattern 18 are related to the transmittance. In this embodiment, the transmittance of the translucent pattern 18 is substantially between 25% and 40% and the length of the translucent pattern 18 is substantially between 2 micrometers and 7 micrometers. Therefore, the length of the extension portion 34E, i.e. the distance between the outside edge of the extension portion 34E and the imaginary extension line L, is substantially between 0.2 micrometers and 3 micrometers, but it is not limited herein. Besides, it should be noted that the most area of the semiconductor layer 26 locates under the drain electrode 34D and the source electrode 34S, and the most area of the semiconductor layer 26 is covered by the drain electrode 34D and the source electrode 34S. When the photoresist layer 32 is a positive photoresist, only parts of the semiconductor layer 26 corresponding to the transparent single slit 16 and the translucent pattern 18 of the photo-mask 10 is uncovered. When the photoresist layer 32 is a negative photoresist, the transparent single slit 16 of the photo-mask 10 is required to change to an opaque single slit and only parts of the semiconductor layer 26 corresponding to the opaque single slit and the translucent pattern 18 of the photo-mask 10 is uncovered.

The length of the channel 34C of the thin film transistor 50 of the invention may, by the design of the transparent single slit 16 of the photo-mask 10, reduce to a value between 1.5 micrometers and 3.5 micrometers to effectively improve the turn-on current. Besides, the extension portion 34D of the semiconductor layer 26 of the invention has the effect of improving the turn-on current confirmed by the experiment. Please refer to FIG. 7. FIG. 7 shows a relation between the extension portion and the turn-on current. As shown in FIG. 7, under the condition that the voltage difference $V_{DS}$ between the drain electrode and the source electrode is 5V, the voltage difference $V_{GS}$ between the gate electrode and the source electrode is 20V, and without the light exposure, it can be found that if the standard length of the extension portion is 2 micrometers, then when the length of the extension portion increases to 4 micrometers and 6 micrometers, the turn-on current increases 26% and 40.4% respectively. As a result, the extension portion actually has the effect of improving the turn-on current of the thin film transistor device.

Consequently, the photo-mask of the invention has the design of the transparent single slit and the translucent pattern, and therefore the channel length of the thin film transistor can be reduced and the extension portion of the semiconductor layer can be formed. As a result, the thin film transistor has a larger turn-on current and can be applied to large sized display panels, without increasing the aperture rate and the load of resistances and capacitors, to improve the quality of the display panel.

Those skilled in the art will readily observe that numerous modifications and alterations of the device and method may be made while retaining the teachings of the invention.

What is claimed is:

1. A method of making a source/drain electrode and a channel of a thin film transistor, comprising:

providing a substrate and sequentially forming a semiconductor layer and a metal layer on the substrate;

providing a photo-mask, wherein the photo-mask comprises:
- a transparent substrate;
- a first opaque pattern and a second opaque pattern disposed on the transparent substrate, wherein the first opaque pattern comprises a first side edge and a second side edge, the second opaque pattern comprises a third side edge and a fourth side edge, and the first side edge of the first opaque pattern is disposed in opposition to the third side edge of the second opaque pattern;
- a transparent single slit disposed between the first side edge of the first opaque pattern and the third side edge of the second opaque pattern; and
- at least a translucent pattern disposed on the transparent substrate, wherein the translucent pattern is connected to the second side edge of the first opaque pattern and the translucent pattern is connected to the fourth side edge of the second opaque pattern, wherein the translucent pattern is not located between the transparent substrate and the first opaque pattern, and is not located between the transparent substrate and the second opaque pattern;

forming a photoresist layer on the metal layer and using the photo-mask to perform an exposure process on the photoresist layer, wherein the first opaque pattern and the second opaque pattern of the photo-mask correspond to a first region of the photoresist layer, the transparent single slit of the photo-mask corresponds to a second region of the photoresist layer, and the translucent pattern of the photo-mask corresponds to a third region of the photoresist layer;

performing a development process on the photoresist layer to remove a portion of the photoresist layer to uncover the metal layer, wherein, after the development process, a thickness of the photoresist layer of the first region is thicker than a thickness of the photoresist layer of the second region and a thickness of the photoresist layer of the third region;

removing the metal layer and the semiconductor layer uncovered by the photoresist layer;

performing an ashing process on the photoresist layer to reduce the thickness of the photoresist layer of the first region and removing the photoresist layer of the second region and the photoresist layer of the third region to uncover the metal layer;

removing the metal layer and a portion of the semiconductor layer uncovered by the photoresist layer to define a source electrode, a drain electrode, a channel and an extension portion; and removing the photoresist layer.

2. The method of making a source/drain electrode and a channel of a thin film transistor of claim 1, wherein a transmittance of the translucent pattern is substantially between 25% and 40%.

3. The method of making a source/drain electrode and a channel of a thin film transistor of claim 1, wherein the translucent pattern has a length substantially between 2 micrometers and 7 micrometers.

4. The method of making a source/drain electrode and a channel of a thin film transistor of claim 1, wherein the semiconductor layer comprises an amorphous silicon semiconductor layer.

5. The method of making a source/drain electrode and a channel of a thin film transistor of claim 1, wherein the drain electrode comprises a first side edge and a second side edge, the source electrode comprises a third side edge, the first side edge of the drain electrode is disposed in opposition to the third side edge of the source electrode, and a minimum distance between the first side edge of the drain electrode and the third side edge of the source electrode is substantially between 1.5 micrometers and 3.5 micrometers.

6. The method of making a source/drain electrode and a channel of a thin film transistor of claim 5, wherein the extension portion extends to the outside of an imaginary extension line of the second side edge of the drain electrode.

7. The method of making a source/drain electrode and a channel of a thin film transistor of claim 6, wherein a length of the extension portion is substantially between 0.2 micrometers and 3 micrometers.

8. The method of making a source/drain electrode and a channel of a thin film transistor of claim 1, wherein a minimum distance between the first side edge of the first opaque pattern and the third side edge of the second opaque pattern is substantially between 1.5 micrometers and 2.5 micrometers.

9. A method of making a source/drain electrode and a channel of a thin film transistor, comprising:

providing a substrate and sequentially forming a semiconductor layer and a metal layer on the substrate;

providing a photo-mask, wherein the photo-mask comprises:
- a transparent substrate;
- a first opaque pattern and a second opaque pattern disposed on the transparent substrate, wherein the first opaque pattern comprises a first side edge and a second side edge, the second opaque pattern comprises a third side edge and a fourth side edge, and the first side edge of the first opaque pattern is disposed in opposition to the third side edge of the second opaque pattern; and
- at least a translucent pattern disposed on the transparent substrate, wherein the translucent pattern is connected to the second side edge of the first opaque pattern and the translucent pattern is connected to the fourth side edge of the second opaque pattern to form a transparent single slit defined by the first side edge of the first opaque pattern, the third side edge of the second opaque pattern, the translucent pattern and the transparent substrate, wherein the translucent pattern is not located between the transparent substrate and the first opaque pattern, and is not located between the transparent substrate and the second opaque pattern;

forming a photoresist layer on the metal layer and using the photo-mask to perform an exposure process on the photoresist layer, wherein the first opaque pattern and the second opaque pattern of the photo-mask correspond to a first region of the photoresist layer, the transparent single slit of the photo-mask corresponds to a second region of the photoresist layer, and the translucent pattern of the photo-mask corresponds to a third region of the photoresist layer;

performing a development process on the photoresist layer to remove a portion of the photoresist layer to uncover the metal layer, wherein, after the development process, a thickness of the photoresist layer of the first region is thicker than a thickness of the photoresist layer of the second region and a thickness of the photoresist layer of the third region;

removing the metal layer and the semiconductor layer uncovered by the photoresist layer;

performing an ashing process on the photoresist layer to reduce the thickness of the photoresist layer of the first region and removing the photoresist layer of the second region and the photoresist layer of the third region to uncover the metal layer;

removing the metal layer and a portion of the semiconductor layer uncovered by the photoresist layer to define a source electrode, a drain electrode, a channel and an extension portion; and removing the photoresist layer.

10. The method of making a source/drain electrode and a channel of a thin film transistor of claim 9, wherein a transmittance of the translucent pattern is substantially between 25% and 40%.

11. The method of making a source/drain electrode and a channel of a thin film transistor of claim 9, wherein the translucent pattern has a length substantially between 2 micrometers and 7 micrometers.

12. The method of making a source/drain electrode and a channel of a thin film transistor of claim 9, wherein the semiconductor layer comprises an amorphous silicon semiconductor layer.

13. The method of making a source/drain electrode and a channel of a thin film transistor of claim 9, wherein the drain electrode comprises a first side edge and a second side edge, the source electrode comprises a third side edge, the first side edge of the drain electrode is disposed in opposition to the third side edge of the source electrode, and a minimum distance between the first side edge of the drain electrode and the third side edge of the source electrode is substantially between 1.5 micrometers and 3.5 micrometers.

14. The method of making a source/drain electrode and a channel of a thin film transistor of claim 13, wherein the extension portion extends to the outside of an imaginary extension line of the second side edge of the drain electrode.

15. The method of making a source/drain electrode and a channel of a thin film transistor of claim 14, wherein a length of the extension portion is substantially between 0.2 micrometers and 3 micrometers.

16. The method of making a source/drain electrode and a channel of a thin film transistor of claim 9, wherein a minimum distance between the first side edge of the first opaque pattern and the third side edge of the second opaque pattern is substantially between 1.5 micrometers and 2.5 micrometers.

* * * * *